United States Patent [19]
Tran

[11] Patent Number: 5,436,579
[45] Date of Patent: Jul. 25, 1995

[54] INPUT TRANSITION DETECTION CIRCUIT FOR ZERO-POWER PART

[75] Inventor: Giap H. Tran, San Jose, Calif.

[73] Assignee: Advanced Micro Devices, Inc., Sunnyvale, Calif.

[21] Appl. No.: 118,123

[22] Filed: Sep. 7, 1993

[51] Int. Cl.[6] .......................................... H03K 19/094
[52] U.S. Cl. ........................................ 326/98; 326/121
[58] Field of Search ................ 307/443, 465, 480–481, 307/451; 326/93, 95, 98, 121

[56] References Cited

U.S. PATENT DOCUMENTS

| | | | |
|---|---|---|---|
| 4,549,101 | 10/1985 | Sood | 307/443 |
| 4,665,328 | 5/1987 | Hall | 307/443 X |
| 4,839,539 | 6/1989 | Takata et al. | 307/465 |
| 4,906,862 | 3/1990 | Itano et al. | 307/465 X |
| 4,906,870 | 3/1990 | Gongwer | 307/465 |
| 4,963,769 | 10/1990 | Hiltpold et al. | 307/465 |

*Primary Examiner*—David R. Hudspeth
*Attorney, Agent, or Firm*—Fliesler, Dubb, Meyer & Lovejoy

[57] ABSTRACT

An input transition detection circuit for detecting when an input signal switches states, the input transition detection circuit then providing a time delay signal at a time delay signal node to enable a zero-power part to wake up from a low power mode. The input transition detection circuit includes two inverters and four transistors compared to the two inverters and nine transistors utilized in previous circuits. The two inverters are coupled in series for receiving and delaying the input signal. A first p-channel transistor has its source coupled to receive the input signal and gate coupled to the output of the two inverters. A second p-channel transistor has its source coupled to the output of the two inverters and gate coupled to receive the input signal. A first n-channel transistor is coupled to the drain of the first and second p-channel transistors and provides a current sink which draws less current than either the first or second p-channel transistors providing a voltage to control the gate of a second n-channel transistor. The second n-channel transistor connects the time delay signal node to ground. The second n-channel transistor enables the input transition detection circuit to be faster than previous circuits since only one transistor connects the time delay signal node to ground.

6 Claims, 3 Drawing Sheets

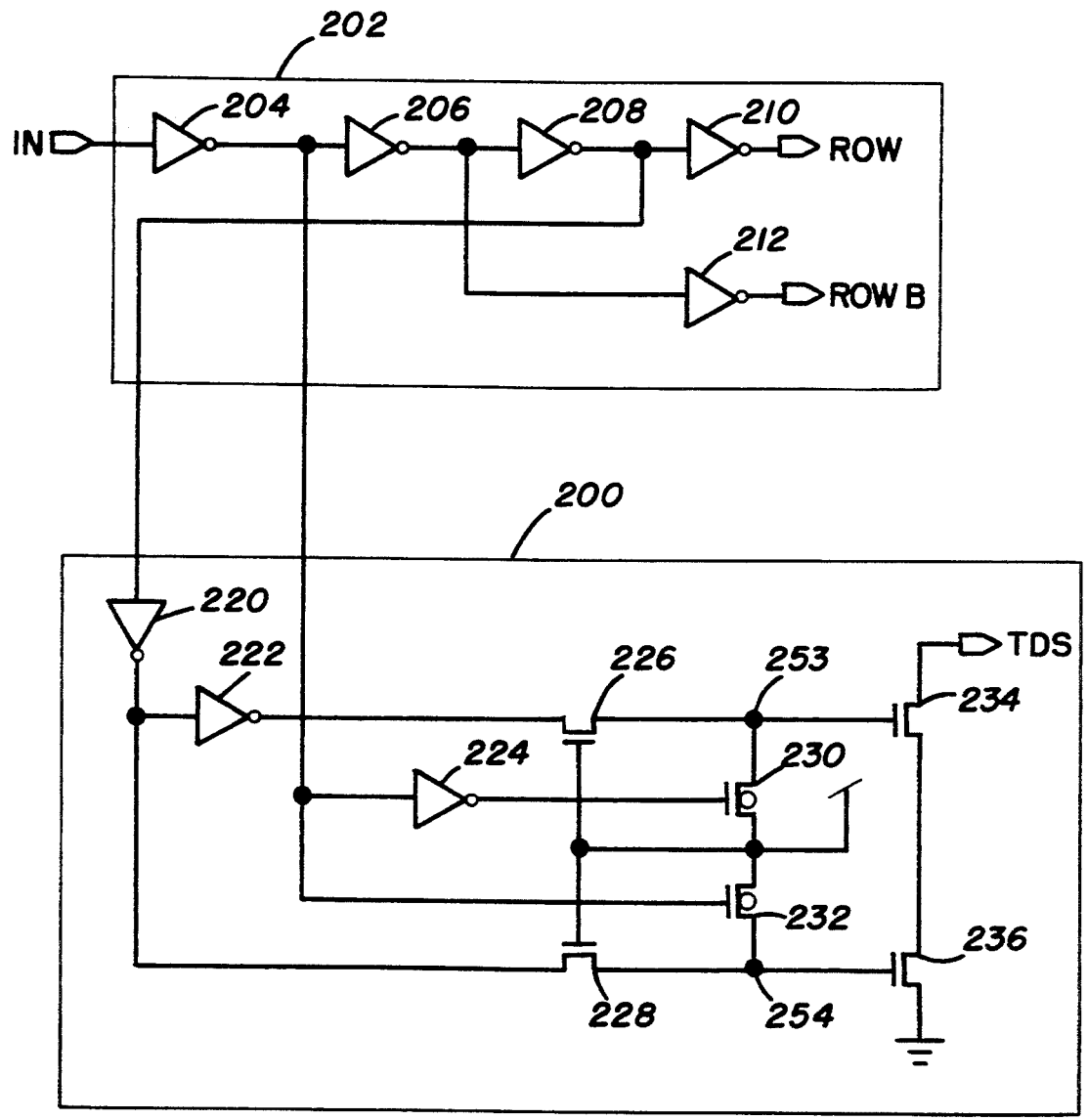
FIG. 2
Prior Art
FIG. 3
Prior Art
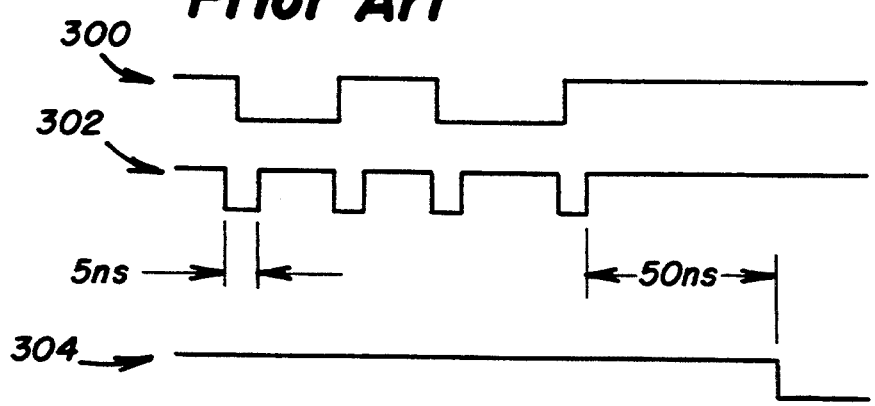

INPUT TRANSITION DETECTION CIRCUIT FOR ZERO-POWER PART

BACKGROUND OF THE INVENTION

1. Field of the Invention

The present invention relates to an input transition detection circuit for detecting when a signal input to a zero-power part switches states, the input transition detection circuit then providing a signal to wake up the zero-power part from a low power mode. More particularly, the present invention relates to circuitry for implementing an input transition detection circuit which can be utilized in a zero-power programmable logic device (PLD).

2. Description of the Prior Art

Electronic circuits in battery powered devices such as notebook computers need to utilize as little power as possible to preserve the batteries for an extended period of time. Even with devices which are not battery powered, it is desirable to have electronic circuits which operate with as little power consumption as possible to conserve energy, thus reducing operational costs.

More recently manufacturers have developed specialized electronic parts, called zero-power parts, for use in battery powered devices such as notebook computers. The zero-power parts have a low power consumption mode, also referred to as a sleep or standby mode, which is entered when the zero-power part has not been accessed for a period of time. During the sleep or standby mode, every circuit in the zero-power part will be turned off, only to be turned back on, or waked up, after an input transition signal is received.

An input transition detection circuit is utilized on the zero-power part to detect any input switching and send a signal to wake up, or power up, a part from a low power mode. The signal provided by the input transition detection circuit is a time delay signal enabling the zero-power part to reenter a sleep mode after the time delay.

An example of a zero-power part currently available is the AmPALCE22V10Z-25, a programmable array logic (PAL) device, a type of PLD, manufactured by Advanced Micro Devices, Inc. The AmPALCE22V10Z-25 is also available in a non zero-power version which provides faster operational speeds since the part does not require time to be powered up from a sleep mode.

FIG. 1 is a block diagram showing components of the AmPALCE22V10Z-25. The AmPALCE22V10Z-25 has an input port labeled I, ten ports which can be configured to be input or output ports labeled I/O, and a port which can be configured to be a clock or an input port labeled CK/I. The ports, when configured as input ports, receive and transmit an input signal to an input buffer of the input buffers labeled 100(a-l). The input buffers enable the AmPALCE22V10Z-25 to be compatible with external circuitry and provide both true and complement outputs. The true and complement outputs provided by the input buffers are received by circuitry functioning as a programmable AND array 102 which drives an OR array 104(a-j) to provide a sum of products term. The outputs from the OR array are provided to output logic macrocells 106 which provide outputs which are programmable to be registered or combinatorial. The outputs from the output logic macrocells are provided to output buffers 108 to be supplied to circuitry external to the AmPALCE22V10Z-25.

In PLDs, such as the AmPALCE22V10Z-25 shown in FIG. 1, every port configurable to be an input port will require an input transition detection circuit to implement a zero-power part.

FIG. 2 shows components of an input transition detection circuit 200 utilized for each port configurable to be an input port on the AmPALCE22V10Z-25. Also shown in FIG. 2 are connections for the input transition detection circuit 200 to an input buffer 202, similar to input buffers 100(a-l) of FIG. 1. Input buffer 202 includes inverters 204, 206 and 208 coupled in series to receive an input signal at a port labeled IN. Inverters 204, 206 and 208 include p-channel pull up transistors with increasingly larger sizes from inverter 204 to inverter 208 and n-channel pull down transistors with decreasingly smaller sizes from inverter 204 to inverter 208. Inverters 204 through 208 have transistors sized to increase power to drive a high capacitance load. Input buffer 202 additionally includes an inverter 210 which is connected to the output of inverter 208 to provide the true output labeled ROW to the programmable AND array 102 of FIG. 1. Also included is an inverter 212 which is connected to the input of inverter 208 to provide the complement output labeled ROWB to the programmable AND array 102 of FIG. 1.

The input transition detection circuit 200 includes two inverters 220 and 222 and nine transistors including six transistors 226, 228, 230, 232, 234 and 236 along with three transistors which make up inverter 224. The circles on transistors, such as 230 and 232, indicate a P-channel transistor, while transistors without the circles are N-channel transistors.

In the input transition detection circuit 200, inverters 220 and 222 are coupled in series from the output of inverter 208 to the source of transistor 226. The drain of transistor 226 is coupled to the gate of transistor 234 at a node 253. The drain of transistor 234 provides a time delay signal (TDS) node to output a time delay signal used to control a low power mode. The source of transistor 234 is connected to the drain of transistor 236 which has its source connected to ground. The output of inverter 220 is connected to the source of transistor 228. The drain of transistor 228 is coupled to the gate of transistor 236 at a node 254. The gates of transistors 226 and 228 are coupled to a system power supply.

Inverter 224 is connected from the output of inverter 204 of input buffer 202 to the gate of transistor 230. The drain of transistor 230 is connected to the gate of transistor 234 at node 253 while the source is connected to the system power supply. The output of inverter 204 is also connected to the gate of transistor 232. The drain of transistor 232 is connected to the gate of transistor 236 at node 254 while the source is connected to the system power supply.

In operation, we begin by assuming an input signal at node IN is high. With node IN high, the output of inverter 204 will be low turning on transistor 232 to pull node 254 high. Transistor 236, having a gate connected to node 254, will thus be on. Note that transistors 230 and 232 are sized to draw more current than transistors 226 and 228 so that if either transistors 230 or 232 are on, they will override transistors 226 and 228.

Meanwhile, with the output of inverter 204 being low, the output of inverter 206 will be high, the output of inverter 208 will be low, and the output of inverter 220 will be high making the output of inverter 222 low.

With the output of inverter 222 being low, node 253 will go to low since transistor 226 is on. Since the output of inverter 204 is low, the output of inverter 224 will be high turning off transistor 230 so that transistor 226 will not be overridden. Transistor 234, having a gate connected to node 253, will be off. With one of the two series transistors 234 and 236 off, there will be no path to ground for node TDS, so node TDS will remain high.

When IN switches from high to low, the output of inverter 204 will go high making the output of inverter 224 low and turning on transistor 230 to pull node 253 high. At this point, both transistors 234 and 236 will be on pulling node TDS to low indicating an input transition detection. With the output of inverter 204 being high, the output of inverter 206 will be pulled low, and the output of inverter 208 will be pulled high pulling the output of inverter 220 low to slowly discharge node 254 through small transistor 228. After a time delay when node 254 has discharged, transistor 236 will turn off, and node TDS will return to high. When IN switches from low to high, the output of inverter 204 will go low turning on transistor 232 to pull node 254 high and turn on transistor 236. With both transistors 234 and 236 now on, node TDS will be pulled low, starting another input transition detection indication. With the output of inverter 206 going high, the output of inverter 208 will go low, and the output of inverter 220 will go high making the output of inverter 222 low and slowly discharging node 253. After a time delay when node 253 has discharged, transistor 234 will turn off, and node TDS will return to high.

In a typical zero-power part, the TDS nodes of the input transition detection circuits for each input buffer of a part are connected together. With the circuitry of FIG. 2, a TDS signal will remain low for a period of approximately 5 nanoseconds after an input transition is detected. A separate circuit, not shown, connected to the TDS nodes provides a signal for transitioning the part into a sleep mode if all TDS signals remain off for a period of approximately 50 nanoseconds.

Thus, as shown in FIG. 3, with an input signal 300, TDS signals 302 of approximately a 5 nanosecond duration will be generated which are used to wake up a part if the part is in a sleep mode. If no input signal transition occurs within 50 nanoseconds, a signal 304 will be generated to transition the part back into a sleep mode.

The performance of an input transition detection circuit is measured by how quickly the input transition detection circuitry can send a wake-up signal after an input transition occurs. Further, because of the number of inputs available on a part, for example 12 on the AmPALCE22V10Z-25, the number of components which make up the input transition detection circuitry should be limited to limit the amount of chip area required for the input transition detection circuitry and to reduce manufacturing costs.

SUMMARY OF THE INVENTION

The present invention enables operation at an increased speed because only one transistor is required from the TDS node to ground as opposed to the two transistors 234 and 236 required in FIG. 2.

Further, the present invention reduces the number of components required to implement an input transition detection circuit by utilizing only two inverters and four transistors compared to the two inverters and nine transistors, including the three transistors forming inverter 224 utilized in the circuit of FIG. 2.

The present invention is an input transition detection circuit including two inverters, two p-channel transistors and two n-channel transistors. The two inverters are coupled in series for receiving and delaying an input signal. A first p-channel transistor has its source coupled to receive the input signal and gate coupled to the output of the two inverters. A second p-channel transistor has its source coupled to the output of the two inverters and gate coupled to receive the input signal. A first n-channel transistor is coupled to the drain of the first and second p-channel transistors and provides a current sink which draws less current than either the first or second p-channel transistors providing a voltage to control the gate of a second n-channel transistor. The second n-channel transistor connects the time delay signal node to ground.

BRIEF DESCRIPTION OF THE DRAWINGS

Further details of the present invention are explained with the help of the attached drawings in which:

FIG. 2 shows components of an input transition detection circuit along with its connection to an input buffer for a PAL device;

FIG. 3 shows a timing diagram for an input signal along with an associated time delay signal generated to indicate an input transition detection and to indicate when a part is to enter a low power mode.

DETAILED DESCRIPTION

Figure 1:
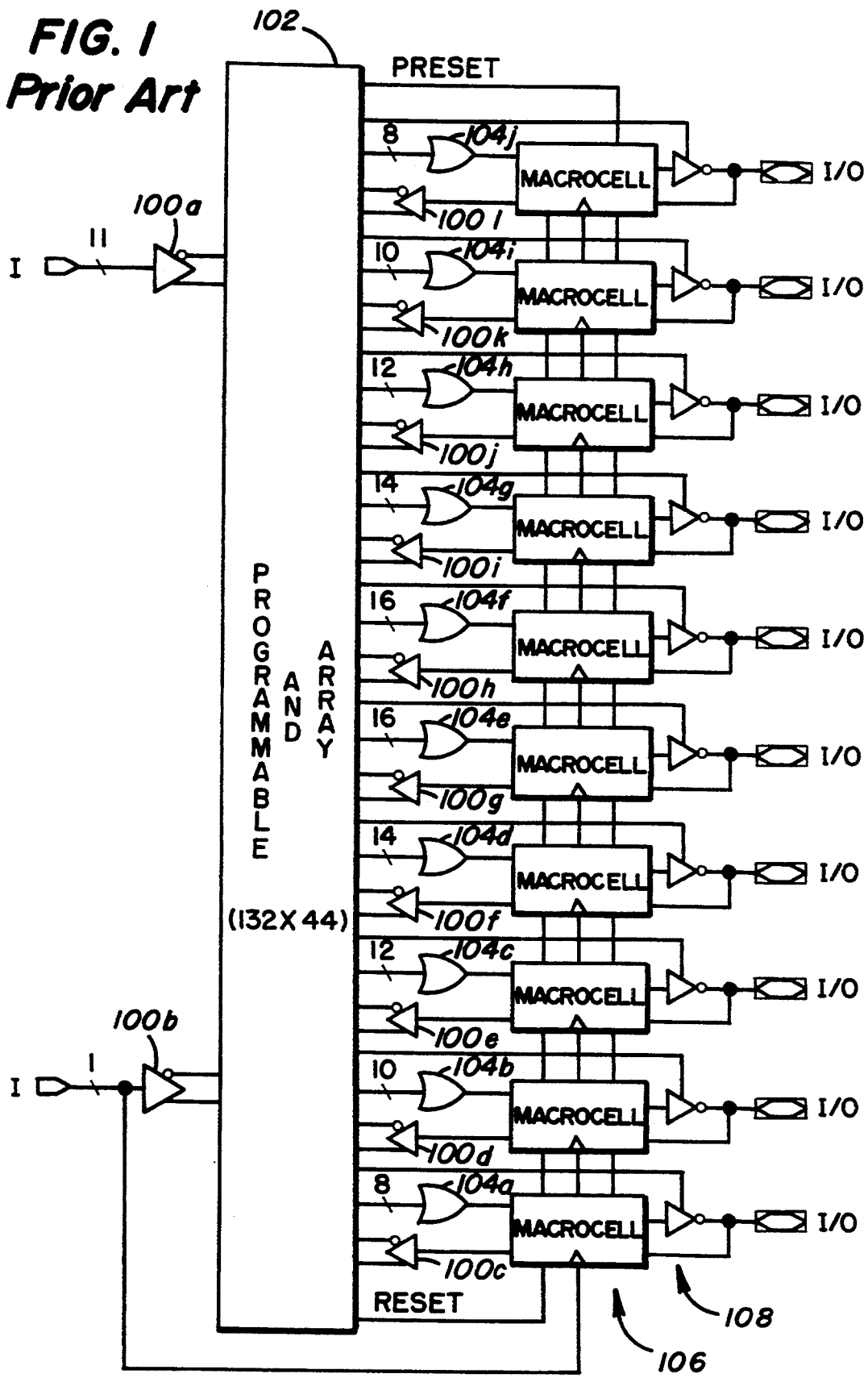
FIG. 1 shows a block diagram for the AmPAL-CE22V10Z-25, a typical zero-power prior art PAL device.
Figure 4:
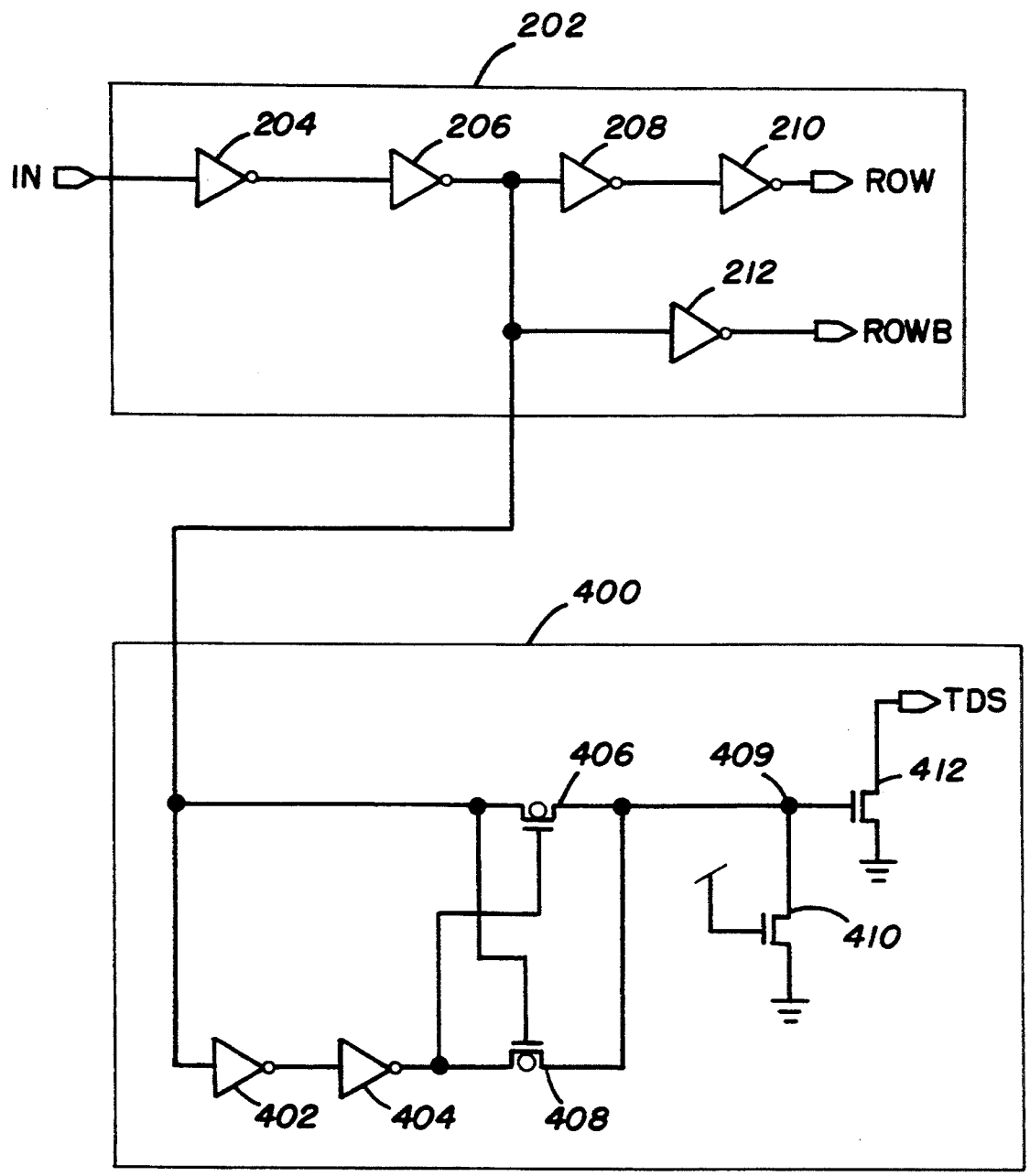
FIG. 4 shows the input transition detection circuit of the present invention along with its connection to an input buffer for a PAL device.

FIG. 4 shows the input transition detection circuit 400 of the present invention. Also shown in FIG. 4 is the connection for the input transition detection circuit 400 to an input buffer 202 of a PAL device such as the that shown in FIG. 2. For convenience, reference numbers for the input buffer 202 and its components are carried over from FIG. 2.

The input transition detection circuit 400 of the present invention includes two inverters 402 and 404, two p-channel transistors 406 and 408, and two n-channel transistors 410 and 412. The input to the input transition detection 400 is formed by the output of inverter 206 of input buffer 202. The output of inverter 206 is connected to the input of the two inverters 402 and 404 connected in series. The output of inverter 206 is also connected to the source of p-channel transistor 406.

The output of inverter 206 is utilized as the input of input transition detection circuit 400 to provide speed as well as to provide power to drive a capacitive load. Note that the input transition detection circuit 200 of FIG. 2 is connected to receive input signals from inverter 204 as well as inverter 208. Inverter 204 will operate faster than inverter 206, but drive a lower capacitance load. Inverter 208 will operate slower than inverter 206, but drive a higher capacitance load.

The output the delay element formed by series inverters 402 and 404 is connected to the gate of p-channel transistor 406 and to the source of p-channel transistor 408. The drains of p-channel transistors 406 and 408 are connected together and to the drain of n-channel transistor 410 and the gate of n-channel transistor 412 to form a node 409. N-channel transistor 410 has its gate connected to a high power potential and source connected to a low power potential to form a current sink. N-channel transistor 410 is sized to draw less current than either P-channel transistor 406 or P-channel transistor 408 to provide a voltage potential to the gate of N-channel transistor 412 depending on the output of P-channel transistors 406 and 408. N-channel transistor 412 has a drain which forms a time delay signal (TDS) indication node and a source connected to the low power potential.

As indicated with respect to the circuitry of FIG. 2, the TDS node of transistor 412 is typically coupled to TDS nodes of other input transition detection circuits in a zero-power part to control a low power or sleep mode. The zero-power part will be powered up from a sleep mode when a TDS signal from an input transition detection circuit is received. As discussed with respect to FIG. 2, a TDS signal will last approximately 5 nanoseconds and additional circuitry will be provided for reentering a sleep mode when a TDS signal has not been received for a period of 50 nanoseconds.

In operation, we begin by assuming an input signal at node IN is high. With node IN high, the output of inverter 204 will be low making the output of inverter 206 high making the output of the delay element formed by series inverters 402 and 404 high. With the output of inverters 402 and 404 being high, both transistors 406 and 408 will be off, and node 409 will be held low by small transistor 410. With node 409 being held low, transistor 412 will be off holding node TDS high.

When IN switches from high to low, the output of inverter 204 will go high making the output of inverter 206 low. With the output of inverter 206 low, transistor 408 turns on pulling node 409 high since the output of the delay element formed by inverters 402 and 404 has not yet switched from high to low, keeping transistor 406 off. With node 409 high, transistor 412 will be on pulling node TDS low. After a short time period required for the delay element formed by inverters 402 and 404 to switch from high to low, transistor 406 will turn on pulling node 409 back low. With node 409 low, transistor 412 is turned off pulling the TDS node back high.

When IN switches from low to high, the output of inverter 204 will go low making the output of inverter 206 high. With the output of inverter 206 high, transistor 408 turns off, but transistor 406 remains on for a short time delay until the output of inverters can switch from low to high. With transistor 406 on, and the output of inverter 206 high, node 409 will be pulled high turning on transistor 412. With transistor 412 on, node TDS will be pulled low. After a short time delay when the output of inverters 402 and 404 switches from low to high, transistor 406 will be turned off, and transistor 410 will pull node 409 low turning off transistor 412. With transistor 412 off, the TDS node will return to high.

Although the invention has been described above with particularity, this was merely to teach one of ordinary skill in the art how to make and use the invention. Many modifications will fall within the scope of the invention, as that scope is defined by the claims which follow. For instance, although the input transition detection circuit of the present invention has been shown to be utilized on a zero-power PAL device, the input transition detection circuit of the present invention may also be utilized on other parts such as an EPROM. Because of the reduced size of the input transition detection circuit from prior circuits, the larger the number of inputs on a device, the more beneficial the present invention utilized on the device will be.

What is claimed is:

1. An input transition detection circuit receiving an input signal to a particular circuit comprising:
   a delay means for receiving and delaying the input signal to create a delayed input signal;
   a first switching transistor having a current path with a first end coupled to receive the input signal and a second end forming a first switching transistor output, the first switching transistor having a gate coupled to the delay means to receive the delayed input signal, the first switching transistor outputting the input signal at the first switching transistor output when the delayed input signal is inactive and not outputting the input signal when the delayed input signal is active;
   a second switching transistor having a current path with a first end coupled to the delay means to receive the delayed input signal and a second end forming a second switching transistor output, the second switching transistor having a gate coupled to receive the input signal, the second switching transistor outputting the delayed input signal at the second switching transistor output when the input signal is inactive and not outputting the delayed input signal when the input signal is active; and
   a time delay signal indication means coupled to the first switching transistor output and the second switching transistor output for supplying a time delay signal when the first switching transistor outputs the input signal and the input signal is active or when the second switching transistor outputs the delayed input signal and the delayed input signal is active, wherein the time delay signal is supplied to the particular circuit to provide control for a low power mode.

2. The input transition detection circuit of claim 1 wherein the time delay signal indication means comprises:
   a gate potential control transistor having a current path coupled on a first end to the first switching transistor output and the second switching transistor output, the gate potential control transistor having a second end of the current path coupled to a first power potential and a gate coupled to a second power potential, the gate potential control transistor outputting a control potential at the first end of the current path when the first switching transistor outputs the input signal and the input signal is active or when the second switching transistor outputs the delayed input signal and the delayed input signal is active; and
   a time delay signal switching transistor having a gate coupled to the first end of the current path of the gate potential control transistor, the time delay signal switching transistor having a current path with a first end coupled to the particular circuit to output a time delay signal and a second end coupled to the second power potential, the time delay signal switching transistor outputting the time delay signal when the gate potential control transistor outputs the control potential.

3. The input transition detection circuit of claim 1 wherein the delay means comprises two inverters connected in series.

4. An input transition detection circuit receiving an input signal comprising:
- two inverters coupled in series having an input for receiving and delaying the input signal and an output;
- a first p-channel transistor having a gate and a source to drain path having a first end and a second end, the first end of the source to drain path coupled to receive the input signal and the gate coupled to the output of the two inverters;
- a second p-channel transistor having a gate and a source to drain path having a first end and a second end, the first and of the source to drain path of the second p-channel transistor coupled to the output of the two inverters and the gate coupled to receive the input signal;
- a first n-channel transistor having a gate connected to a first voltage potential and a source connected to a second voltage potential, the first n-channel transistor drawing less current than the first or second p-channel transistor, the first n-channel transistor having a drain connected to the second end of the source to drain path of the first and second p-channel transistors;
- a second n-channel transistor having a gate connected to the drain of the first n-channel transistor, a source connected to the second voltage potential, and a drain supplying an output for the input transition detection circuit.

5. An input transition detection circuit including a means for receiving an input signal which generates therefrom a switching signal to enable a time delay signal generation means to provide a time delay signal at a TDS node, the time delay signal generation means consisting of:
- a transistor having a gate coupled to receive the switching signal and a source to drain path connected, with no intervening element, on a first end to the TDS node and connected, with no intervening element, on a second end to a power potential.

6. A programmable array logic device comprising:
- a plurality of input buffers for receiving a plurality of input signals and outputting buffered input signals;
- a plurality of input transition detection circuits, each input transition detection circuit coupled to a respective input buffer in the plurality of input buffers to receive a given input signal from the plurality of input signals received by the plurality of input buffers, each input transition detection circuit comprising;
- two series inverters for receiving and delaying the given input signal and creating a delayed output signal;
- a first switching transistor having a current path with a first end coupled to receive the given input signal and a second end forming a first switching transistor output, the first switching transistor having a gate coupled to the two series inverters to receive the delayed input signal, the first switching transistor outputting the given input signal at the first switching transistor output when the delayed input signal is inactive and not outputting the given input signal when the delayed input signal is active;
- a second switching transistor having a current path with a first end coupled to the two series inverters to receive the delayed input signal and a second end forming a second switching transistor output, the second switching transistor having a gate coupled to receive the given input signal, the second switching transistor outputting the delayed input signal at the second switching transistor output when the given input signal is inactive and not outputting the delayed input signal when the given input signal is active;
- a gate potential control transistor having a current path coupled on a first end to the first switching transistor output and the second switching transistor output, the gate potential control transistor having a second end of the current path coupled to a first power potential and a gate coupled to a second power potential, the gate potential control transistor outputting a control potential at the first end of the current path when the first switching transistor outputs the given input signal and the given input signal is active or when the second switching transistor outputs the delayed input signal and the delayed input signal is active; and
- a time delay signal switching transistor having a gate coupled to the first end of the current path of the gate potential control transistor, the time delay signal switching transistor having a current path with a first end provided to output a time delay signal and a second end coupled to the second power potential, the time delay signal switching transistor outputting the time delay signal when the gate potential control transistor outputs the control potential, wherein the time delay signal is utilized by the programmable array logic device to increase power consumption when the time delay signal is received during a standby mode, and to reduce power consumption a period of time after the time delay signal is received;
- a programmable AND array means coupled to the plurality of input buffers to receive the buffered input signals, the programmable AND array means outputting a product term;
- an OR array means coupled to the programmable AND array means to receive the product term, the OR array means outputting a sum of products term; and
- a plurality of output logic macrocells coupled to the OR array means to receive the sum of products term, the plurality of output logic macrocells having outputs programmable to output the sum of products term in a registered or combinatorial fashion.

* * * * *